(12) United States Patent
Patterson et al.

(10) Patent No.: US 7,456,636 B2
(45) Date of Patent: Nov. 25, 2008

(54) TEST STRUCTURES AND METHOD OF DEFECT DETECTION USING VOLTAGE CONTRAST INSPECTION

(75) Inventors: Oliver D. Patterson, Poughkeepsie, NY (US); Huilong Zhu, Poughkeepsie, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 11/308,487

(22) Filed: Mar. 29, 2006

(65) Prior Publication Data

US 2007/0229092 A1 Oct. 4, 2007

(51) Int. Cl.
*G01R 31/02* (2006.01)
*G01R 31/26* (2006.01)
*H01L 23/62* (2006.01)

(52) U.S. Cl. .............. 324/537; 324/765; 257/347
(58) Field of Classification Search .............. None
See application file for complete search history.

(56) References Cited

U.S. PATENT DOCUMENTS

| | | | | |
|---|---|---|---|---|
| 5,557,135 A * | 9/1996 | Hashimoto | ................ | 257/307 |
| 5,959,459 A | 9/1999 | Satya et al. | | |
| 6,049,109 A * | 4/2000 | Omura et al. | ................ | 257/347 |
| 6,452,412 B1 * | 9/2002 | Jarvis et al. | ................ | 324/765 |
| 6,563,321 B2 * | 5/2003 | Kikuchi | ................ | 324/522 |
| 6,720,779 B1 * | 4/2004 | Lee | ................ | 324/751 |
| 6,727,501 B1 * | 4/2004 | Fan et al. | ................ | 250/307 |
| 6,855,568 B2 | 2/2005 | Weiner et al. | | |
| 6,861,666 B1 | 3/2005 | Weiner et al. | | |
| 2002/0151091 A1 * | 10/2002 | Shaw et al. | ................ | 438/14 |
| 2003/0071262 A1 | 4/2003 | Weiner et al. | | |
| 2003/0098706 A1 * | 5/2003 | Schroeder | ................ | 324/765 |
| 2003/0234430 A1 * | 12/2003 | Friend et al. | ................ | 257/428 |
| 2007/0090460 A1 * | 4/2007 | Agam et al. | ................ | 257/355 |

OTHER PUBLICATIONS

Patterson et al., "Rapid Reduction of Gate-Level Electrical Defectivity using Voltage Contrast Test Structures," Proceedings of ASMC, pp. 266-272, Mar. 2003.
Wang et al., "The Study and Methodology of Defects Isolation for Contacts of Non-isolated Active Regions on New Logic Designs," ASM International, pp. 479-483, San Jose, California, Nov. 2005.

(Continued)

*Primary Examiner*—Diego Gutierrez
*Assistant Examiner*—Jeff Natalini
(74) *Attorney, Agent, or Firm*—Hoffman Warnick LLC; Lisa U. Jaklitsch

(57) ABSTRACT

Test structures and a method for voltage contrast (VC) inspection are disclosed. In one embodiment, the test structure includes: a gate stack that is grounded by a ground to maintain the gate stack in an off state during VC inspection, which allows NFET defect detection using VC inspection prior to contact dielectric deposition. The test structure may alternatively include a gate stack that is biased by a bias to maintain the gate stack in an on state during VC inspection. The method may detect source-to-drain shorts in a transistor using VC inspection by providing a gate stack over a source and drain region of the transistor that is grounded by a ground to maintain the gate stack in an off state during VC inspection; and inspecting the transistor using voltage contrast. If the drain of the NFET brightens during VC inspection, this indicates a source to drain short.

11 Claims, 4 Drawing Sheets

OTHER PUBLICATIONS

Baltzinger et al., "E-beam inspection of dislocations: product monitoring and process change validation," Proceedings of ASMC, pp. 359-366, 2004.

Weiner et al., "Defect Management for 300 mm and 130 nm Technologies, Part 3: Another Day, Another Yield Learning Cycle," Yield Management Solutions, pp. 15-28, 2002.

\* cited by examiner

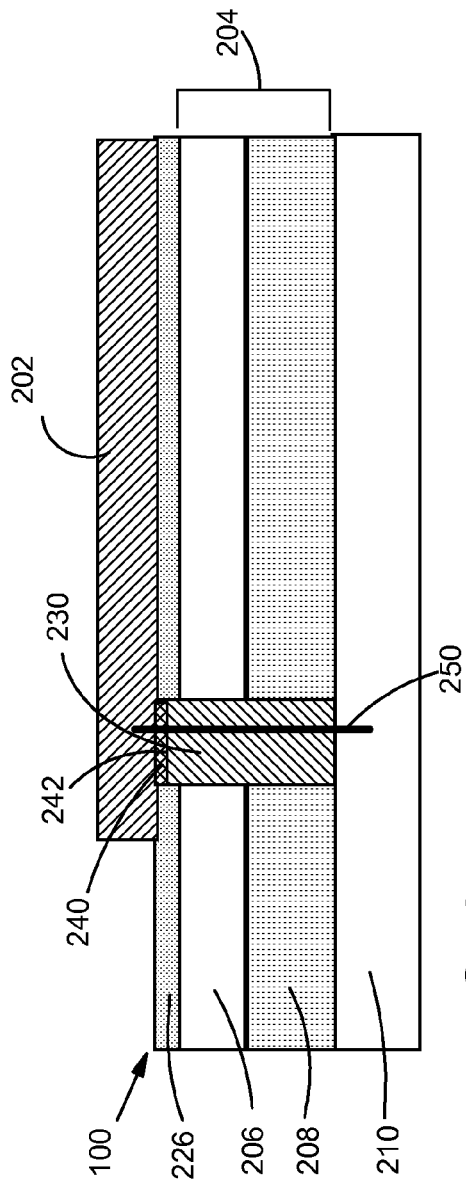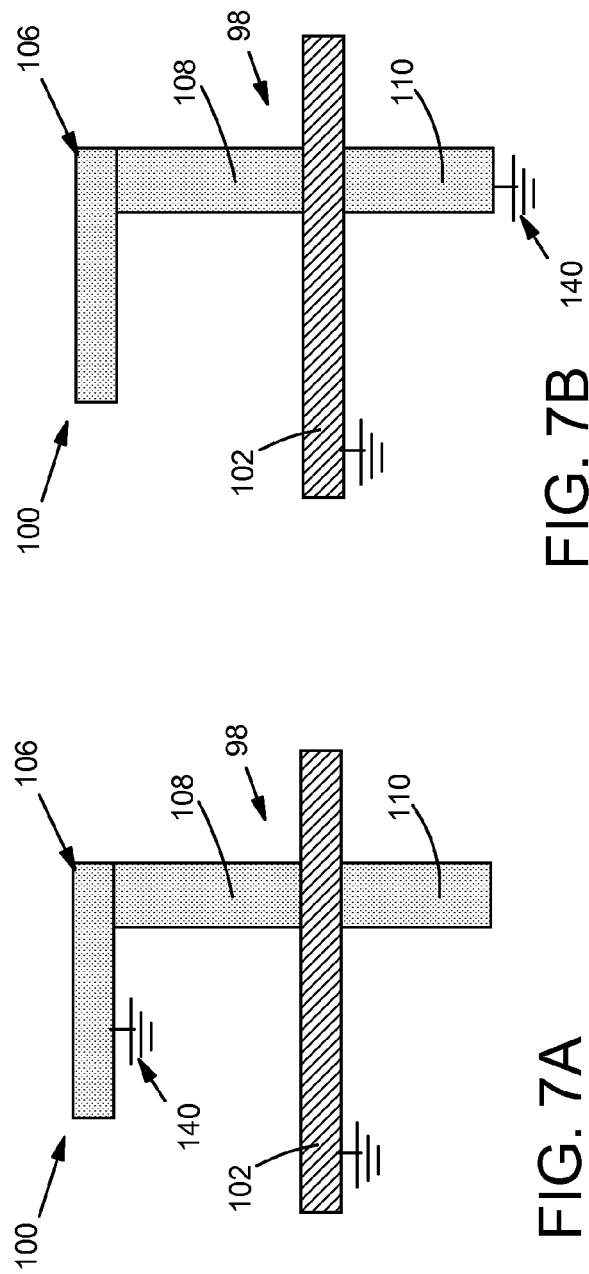

TEST STRUCTURES AND METHOD OF DEFECT DETECTION USING VOLTAGE CONTRAST INSPECTION

This application relates to U.S. patent application Ser. No. 11/308,408, filed Mar. 22, 2006, entitled GROUNDING FRONT-END-OF-LINE STRUCTURES ON A SOI SUBSTRATE, which is hereby incorporated herein by reference.

BACKGROUND OF THE INVENTION

1. Technical Field

The invention relates generally to semiconductor fabrication, and more particularly, to test structures and a method of detecting defects using voltage contrast inspection.

2. Background Art

In-line voltage contrast (VC) inspection is a powerful technique for detecting and isolating yield limiting defects in the semiconductor fabricating industry. In-line VC inspection includes scanning the wafer surface in which test structures exist with a scanning electron microscope (SEM). As the inspection proceeds, the SEM induces charge on all electrically floating elements whereas any grounded elements remain at zero potential. This potential difference is visible to the SEM. In particular, for electron landing energies less than the second crossover of the secondary electron yield curve (approximately 1.5 keV for tungsten (W) and copper (Cu)), grounded elements appear bright whereas floating elements appear dark.

Test structures exploiting this phenomenon can be created for many yield limiting defects including metal, gate and active region shorts and opens, and via and contact opens. For example, FIGS. 1A-B, show a short (FIG. 1B) indicated by a normally floating (dark) element becoming bright, and an open (FIG. 1A) indicated when a normally bright element becomes dark. As shown, even if the defect causing the electrical failure is buried or extremely small, its existence is indicated by a change in the VC signal of the entire element. In addition, the exact location of an open is indicated by a change in the VC signal of the structure after the break.

In addition to timely detection of yield limiting defects, this technique has several other major advantages. First, the location of a defect is flagged by the VC signal. Even if the defect causing the short is buried or extremely small, the VC signal appears on the entire element. Second, large areas can be inspected providing a large volume of data.

Transistor level defects such as dislocations and silicide pipes causing source to drain shorts is a problem in state of the art microelectronic fabrication due to the small scale of today's state of the art transistors. New methods to reduce these defects are required. Voltage contrast inspection may be applied to this problem. For a p-type field effect transistor (PFET), a simple test structure may be created in which the source is grounded and the state (grounded or floating) of the drain is sensed. If the drain appears bright in the SEM, this indicates a short through the transistor. Unfortunately, a similar device for an n-type field effect transistor (NFET) does not work because under electron extraction conditions (i.e., where a positive charge is induced on the surface), the gate of the device charges up just like any other exposed floating structure. Once the gate sufficiently charges to reach the turn-on voltage, the NFET turns on. In this case, the drain appears grounded (bright) for both good and defective transistors. This structure could be inspected using electron retarding conditions (i.e., where a negative charge is induced on the surface), but extraction conditions provide much better resolution than electron retarding conditions and are not only preferable but possibly necessary for future technologies. Another drawback of operating in electron retarding conditions is that the PFETs would now turn on. Therefore, NFET and PFET structures could not be inspected in the same scan.

One approach to providing a solution to this problem is to inspect for source-to-drain shorts after contact formation of the first metal level. In this case, the test structure may be designed so that no exposed conductor would make contact to the gate so that the gate would not charge up and turn on. One drawback to this approach is that substantial additional processing is required causing a substantial time penalty in the learning cycle and substantial additional investigative work to identify the failure once detected. In another approach, failures are isolated using an electrical test and then the cause of the failures are investigated and identified using standard failure analysis techniques. This approach, however, requires substantially more time for additional processing, test and then failure analysis. Also failures are isolated one at a time rather than in large numbers as with large area VC inspection.

In view of the foregoing there is a need in the art for a solution to the problems of the related art.

SUMMARY OF THE INVENTION

Test structures and a method for voltage contrast (VC) inspection are disclosed. In one embodiment, the test structure includes: a gate stack that is grounded by a ground to maintain the gate stack in an off state during VC inspection, which allows NFET defect detection using VC inspection prior to contact dielectric deposition. The test structure may alternatively include a gate stack that is biased by a bias to maintain the gate stack in an on state during VC inspection. The method may detect source-to-drain shorts in a transistor using VC inspection by providing a gate stack over a source and drain region of the transistor, in which the gate and source electrodes are grounded by a ground to maintain a channel under the gate stack in an off state during VC inspection; and inspecting the transistor using voltage contrast inspection. If the drain of the NFET brightens during VC inspection, this indicates a source to drain short. This inspection allows much shorter learning cycles for source to drain shorts.

A first aspect of the invention provides a test structure for voltage contrast (VC) inspection of a transistor, the test structure comprising: a gate stack that is grounded by a ground to maintain a channel under the gate stack in an off state during VC inspection.

A second aspect of the invention provides a test structure for voltage contrast (VC) inspection of a transistor, the test structure comprising: a gate stack that is biased by a bias to maintain the gate stack in an on state during VC inspection.

A third aspect of the invention provides a method of detecting a source-to-drain short in a transistor using voltage contrast (VC) inspection, the method comprising: providing a gate stack over a source and drain region of the transistor that is grounded by a ground to maintain the gate stack in an off state during VC inspection; and inspecting the transistor using voltage contrast.

The illustrative aspects of the present invention are designed to solve the problems herein described and/or other problems not discussed.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which:

FIG. 6 shows an alternative embodiment of grounding a gate stack according to the invention.

FIGS. 7A-B show alternative embodiments of a test structure in which a source region or drain region are grounded according to the invention.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

Figure 1B:
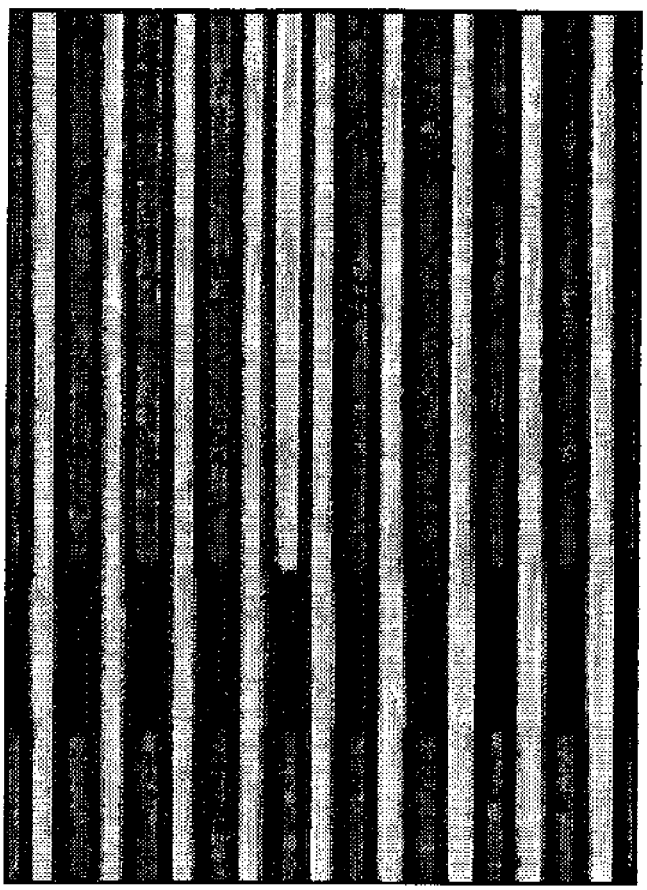
FIGS. 1A-B show images of defects observed using conventional voltage contrast inspection.
Figure 1A:
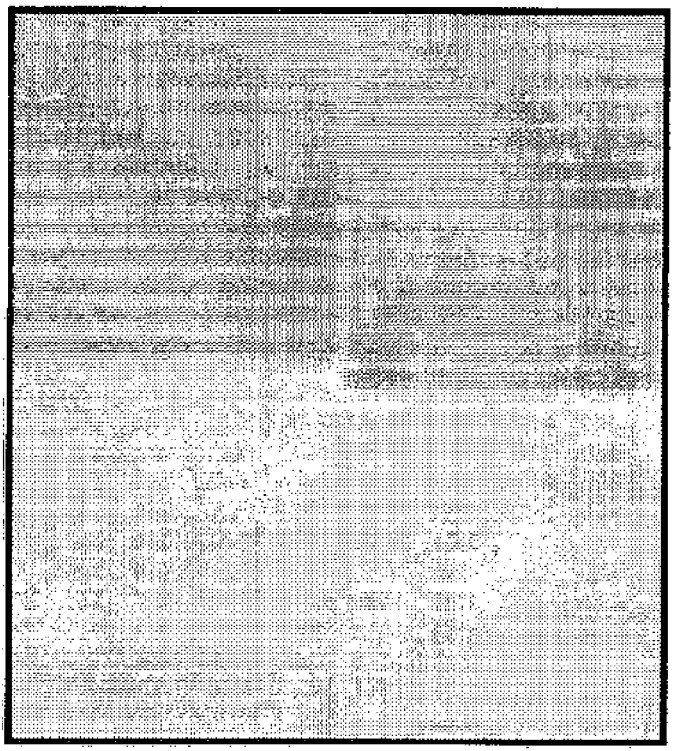
Figure 2:
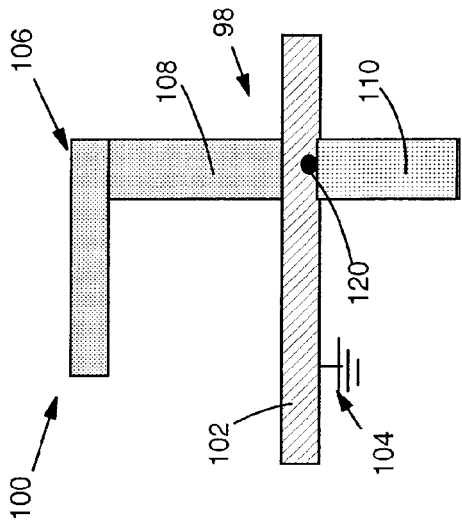
FIG. 2 shows a test structure for VC inspection of a transistor according to one embodiment of the invention.

Turning to FIG. 2, as indicated above, embodiments of the invention provide test structures and a method for voltage contrast (VC) inspection of a transistor 98 (FIG. 2). In one embodiment, a test structure 100 includes: a gate stack 102, e.g., of polysilicon, that is grounded by a ground 104 to maintain a channel (not shown) under gate stack 102 in an off state during VC inspection. Test structure 100 may further include an active region 106 including a source region 108 and a drain region 110. Where ground 104 is part of an n-type field effect transistor (NFET) 98, it prevents a channel (not visible, where gate stack 102 and active region 106 intersect) of the NFET from conducting during VC inspection using electron extraction conditions if no defect exists in a gate dielectric and the channel of the NFET. In contrast, where gate stack 102 is part of a p-type field effect transistor (PFET) 98, it prevents a channel (not visible, where gate stack 102 and active region 106 intersect) of the PFET from conducting during VC inspection using electron retarding conditions if no defect exists in a gate dielectric and the channel of the PFET. VC inspection may be performed using a scanning electron microscope (SEM) or any other now known or later developed tool for detecting voltage contrast. Furthermore, VC inspection may occur, for example, in an in-line setting and/or an end-of-line setting during any failure analysis. VC inspection may include a scan and/or a spot inspection.

Figure 3:
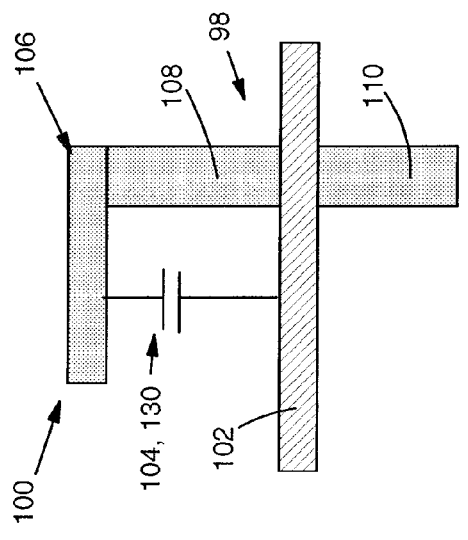
FIG. 3 shows the test structure of FIG. 2 under VC inspection and including a defect.
Figure 4:
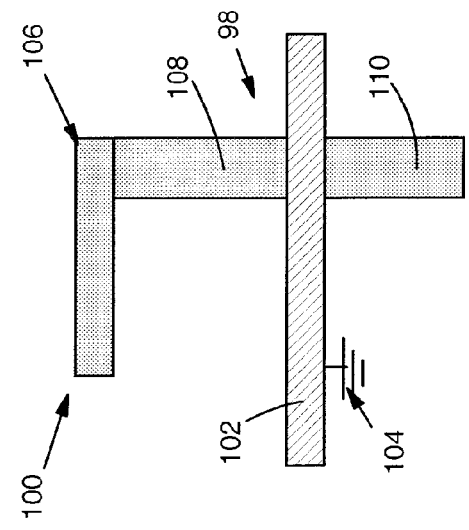
FIG. 4 shows the test structure of FIG. 2 under VC inspection and indicating a good structure.

As a result of test structure 100, an NFET may be inspected for defects using VC inspection prior to contact dielectric deposition. As shown in FIG. 3, if drain region 110 of an NFET lights up (becomes as bright as the source) during VC inspection, this indicates a source to drain short 120. That is, if there is a short, the drain will become the same brightness as the source. Note, source to drain defect 120 may be hidden behind gate stack 102. In contrast, as shown in FIG. 4, if drain region 110 of an NFET appears much darker than the source during VC inspection, this indicates a good structure exists.

Figure 5:
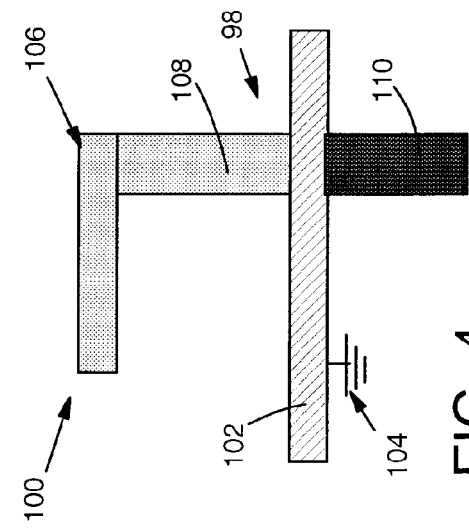
FIG. 5 shows the test structure of FIG. 2 including one embodiment of a ground for the test structure.

Ground 104 may be provided in a number of different forms. In one embodiment, shown in FIG. 5, ground 104 is provided as a gate stack 102 to active region 106 capacitor 130. In another embodiment, shown in FIG. 6, in the case that transistor 98 (FIG. 2) is within a silicon-on-insulator (SOI) substrate 204 over a grounded bulk silicon substrate 210, ground 104 (FIG. 2) may be provided by grounding gate stack 202 through SOI substrate 204, as described more fully in co-pending and co-owned U.S. patent application Ser. No. 11/308,408. In particular, SOI substrate 204 includes a silicon-on-insulator (SOI) layer 206 and a buried oxide (e.g., silicon oxide ($SiO_2$) (BOX) layer 208 over grounded bulk silicon substrate 210. A polysilicon ground 230 extends through SOI layer 206 and BOX layer 208 to bulk silicon substrate 210. A gate oxide ($SiO_2$) layer 240 of gate stack 202 is included on an upper surface 242 of polysilicon ground 230. Gate oxide layer 240 of gate stack 202 is insufficiently insulative to prevent electrical conductivity therethrough. In one embodiment, upper surface 242 of polysilicon ground 230 is uneven so as to make gate oxide layer 240 insufficiently insulative to prevent electrical conductivity therethrough. Polysilicon gate stack 202 contacts gate oxide layer 240. Because gate oxide layer 240 is electrically leaky, it provides a ground from polysilicon gate stack 202 to grounded bulk silicon substrate 210. Since test structure 100 is present prior to formation of polysilicon gate stack 202, it may advantageously be used as a part of a voltage contrast test structure. In addition, test structure 100 may be used in a product chip and positioned for charge dissipation.

Test structure 100, according to this embodiment, may be formed by using a mask to form openings through SOI substrate 204. The openings are filled with polysilicon, and the surface is polished. However, the polysilicon of polysilicon ground 230 grows conformally so that the sides of the polysilicon crystals are exposed to the surface, i.e., the top of the opening. This exposed surface 242 results in a polysilicon that is more bumpy and uneven than the surface of polysilicon (e.g., polysilicon gate stack 202) grown vertically across much of the wafer surface. As a result, gate oxide layer 240, i.e., gate dielectric, grown over this uneven upper surface 242 will be extremely leaky. By generating a large enough area where polysilicon gate stack 202 overlaps with masking level, a substantial ground path 250 may be created.

In an alternative embodiment, the invention may also include a method of detecting a source-to-drain short in a transistor 98 using voltage contrast (VC) inspection. Returning to FIG. 2, the method may include, in one embodiment, providing gate stack 102 over source 108 and drain 110 region of transistor 98 that is grounded by ground 104 to maintain gate stack 102 in an off state during VC inspection, and inspecting transistor 98 using voltage contrast. In one embodiment, the inspecting step is performed using an SEM, however, any now known or later developed technique for voltage contrast inspection may be used. VC inspection, in one embodiment, may be performed after silicide formation. For a good transistor, drain region 110 would be floating (dark), as shown in FIG. 4, whereas a grounded (bright), as shown in FIG. 3, drain region 110 would indicate a short.

Turning to FIGS. 7A-B, in an alternative embodiment, source region 108 (FIG. 7A) for gate stack 102 or drain region 110 (FIG. 7B) may be grounded by an inspection ground 140, which creates a grounded region (108 in FIG. 7A, 110 in FIG. 7B). The term "inspection ground" is simply for differentiating from the above-described ground 104. For purposes of brevity, the following description shall reference grounding only of source region 108. It is understood, however, that the teachings are equally applicable to grounding of drain region 110 with the notable exception that what is inspected changes. That is, if source region 108 is grounded, then drain region 110 is inspected by VC inspection. In contrast, if drain region 110 is grounded, then source region 108 is inspected by VC inspection.

Figure 8:
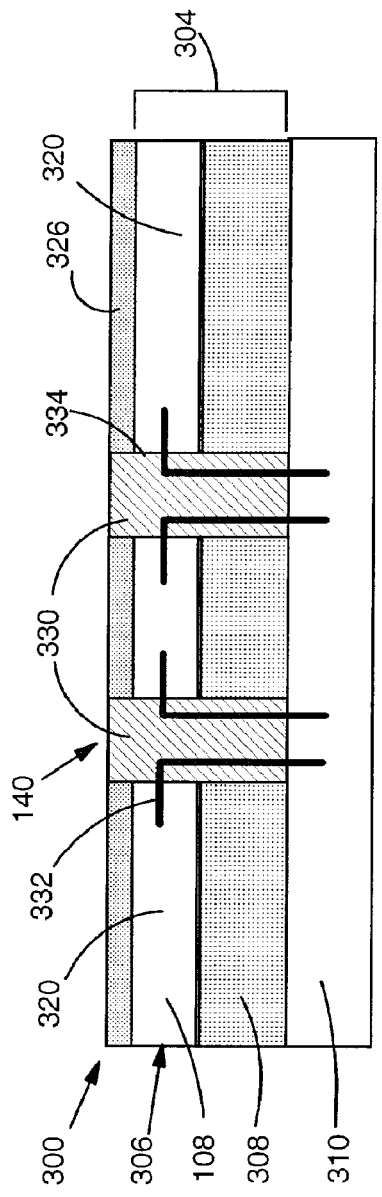
FIGS. 8 and 9 show one embodiment of grounding a source region according to the invention.
Figure 9:
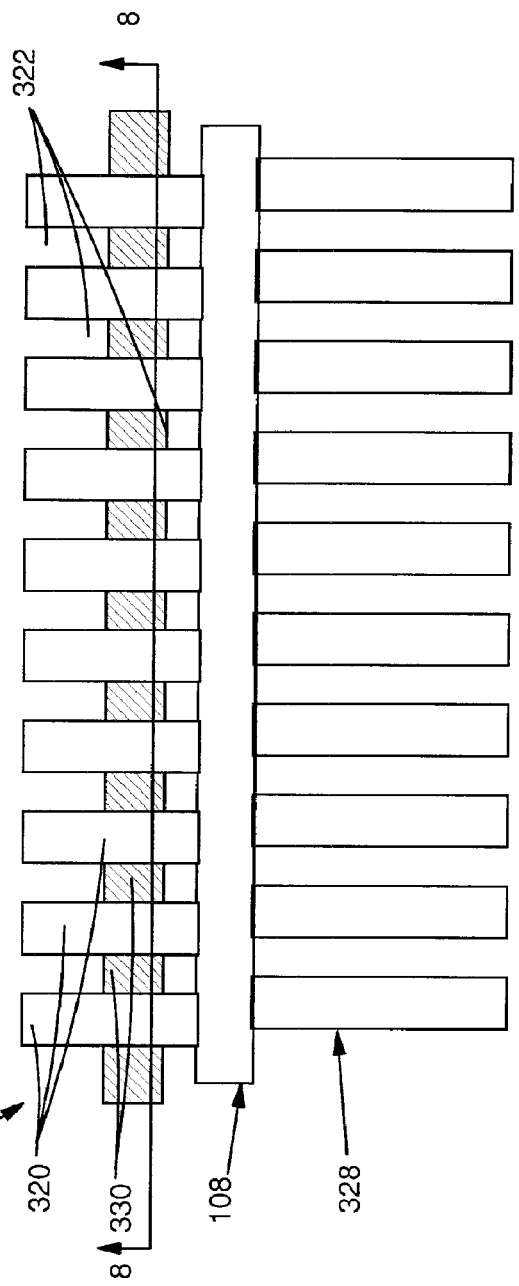

As further described in U.S. patent application Ser. No. 11/308,408, and as shown in FIGS. 8 and 9, in the case that source region 108 (silicon active region) is within an SOI substrate 304 over a grounded bulk silicon substrate 310, inspection ground 140 maybe implemented as at least one finger element 320 within an SOI layer 306 of SOI substrate 304. In one embodiment, a plurality of finger elements 320 are within SOI layer 306 (FIG. 8). Each finger element 320 is isolated by a shallow trench isolation (STI) layer 322 (FIG. 9) of, for example, silicon oxide ($SiO_2$). For example, each finger element 320 may be separated from an adjacent finger element 320 by STI layer 322 (FIG. 9). STI layer 322 is not shown in FIG. 8 because they have been replaced by polysilicon ground 330, as will be described below. FIG. 8 is viewing FIG. 9 along line 8-8. FIG. 9 is shown with a baffler layer 326 (FIG. 8) of, for example, silicon nitride ($Si_3 N_4$) removed. Other test structures 328 maybe provided as part of source region 108. A polysilicon ground 330 intersects finger element(s) 320 and extends through baffler layer 326, STI layer 322 and BOX layer 308 to grounded bulk silicon substrate 310. In particular, polysilicon ground 330 replaces a part of STI layer 322 between adjacent to a finger element, if only one is provided, or between adjacent finger elements 320 where a plurality of finger elements are provided. Polysilicon ground 330 contacts source region 108 and grounded bulk silicon substrate 310 so as to provide a ground path 332 (only one labeled) from source region 108 to grounded bulk silicon substrate 310. Polysilicon ground 330 contacts a sidewall 334 of source region 108, i.e., a sidewall of a finger element 320. As noted above, the teachings of FIGS. 8-9 are equally applicable to grounding a drain region 110 (FIG. 7B).

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed is:

1. A test structure for voltage contrast (VC) inspection of a transistor, the test structure comprising:
    a gate stack that is grounded by a ground to maintain a channel under the gate stack in an off state of the transistor during VC inspection,
    wherein the ground is distinct from an inspection ground used to ground a source and a drain of the transistor;
    wherein only one of a source region for the gate stack or a drain region for the gate stack is consistently grounded by the inspection ground, providing a grounded region; and
    wherein the transistor is within a silicon-on-insulator (SOI) substrate over a grounded bulk silicon substrate, the SOI substrate including a silicon-on-insulator (SOI) layer and a buried oxide (BOX) layer, the ground includes:
        a polysilicon ground extending through the SOI layer and the BOX layer to the grounded bulk silicon substrate;
        a gate oxide layer of the gate stack on an upper surface of the polysilicon ground, the gate oxide layer being insufficiently insulative to prevent electrical conductivity therethrough; and
    wherein the gate stack contacts the gate oxide layer.

2. The test structure of claim 1, wherein the VC inspection is performed using a scanning electron microscope.

3. The test structure of claim 1, wherein the gate stack is part of an n-type field effect transistor (NFET), and the ground prevents a channel of the NFET from conducting during VC inspection using electron extraction conditions if no defect exists in a gate dielectric and the channel of the NFET.

4. The test structure of claim 1, wherein the gate stack is part of a p-type field effect transistor (PFET), and the ground prevents a channel of the PFET from conducting during VC inspection using electron retarding conditions if no defect exists in a gate dielectric and the channel of the PFET.

5. The test structure of claim 1, wherein the VC inspection occurs in at least one of the following: an in-line setting and an end-of line setting during any failure analysis.

6. The test structure of claim 1, wherein the ground is a gate stack to active region capacitor.

7. A method of detecting a source-to-drain short in a transistor using voltage contrast (VC) inspection, the method comprising:
    providing a gate stack over a source and drain region of the transistor that is grounded by a ground to maintain the gate stack in an off state of the transistor during VC inspection, wherein the ground is distinct from the source and drain, wherein the providing includes consistently grounding only one of a source region for the gate stack or a drain region for the gate stack using an inspection ground, providing a grounded region; and
    inspecting the transistor using voltage contrast; and
    wherein the grounded region is within a silicon-on-insulator (SOI) substrate over a grounded bulk silicon substrate, the SOI substrate including a silicon-on-insulator (SOI) layer and a buried oxide (BOX) layer, wherein the providing includes providing:
        the grounded region including at least one finger element within the SOI layer, the at least one finger element isolated by a shallow trench isolation (STI) layer; and
        the inspection ground including a polysilicon ground intersecting the at least one finger element and extending through the STI layer and the BOX layer to the grounded bulk silicon substrate, the polysilicon ground contacting the grounded region and the grounded bulk silicon substrate.

8. The method of claim 7, wherein the inspecting step is performed using a scanning electron microscope (SEM).

9. The method of claim 7, wherein the transistor is an n-type field effect transistor (NFET), and the ground prevents a channel of the NFET from conducting during the inspecting step using electron extraction conditions if no defect exists in a gate dielectric and the channel of the NFET.

10. The method of claim 7, wherein the transistor is a p-type field effect transistor (PFET), and the ground prevents a channel of the PFET from conducting during the inspecting step using electron retarding conditions if no defect exists in a gate dielectric and the channel of the PFET.

11. The method of claim 7, wherein the ground is a gate stack to active region capacitor.

* * * * *